US012704551B2

(12) United States Patent
Zurek et al.

(10) Patent No.: US 12,704,551 B2
(45) Date of Patent: Aug. 11, 2026

(54) METHOD AND APPARATUS FOR PERFORMING A SURGE TEST OF ELECTRICAL INSULATION

(71) Applicant: Megger Instruments Ltd, Dover (GB)

(72) Inventors: Stanislaw Zurek, Canterbury (GB); Craig Powers, Fort Collins, CO (US); Robert Pray, Fort Collins, CO (US); Daniel Melendy, Fort Collins, CO (US); Daniel Rogge, Fort Collins, CO (US); Leslie Reed, Windsor, CO (US); Michael J. Ewer, Fort Collins, CO (US); Thomas Kreshon, Fort Collins, CO (US)

(73) Assignee: Megger Instruments Ltd, Dover (GB)

( * ) Notice: Subject to any disclaimer, the term of this patent is extended or adjusted under 35 U.S.C. 154(b) by 156 days.

(21) Appl. No.: 18/665,163

(22) Filed: May 15, 2024

(65) Prior Publication Data

US 2025/0264532 A1 Aug. 21, 2025

Related U.S. Application Data

(60) Provisional application No. 63/555,153, filed on Feb. 19, 2024.

(51) Int. Cl.
*G01R 31/34* (2020.01)

(52) U.S. Cl.
CPC .................................. *G01R 31/346* (2013.01)

(58) Field of Classification Search
CPC ... G01R 31/346; G01R 31/1272; G01R 31/14
USPC ..................................................... 324/765.01
See application file for complete search history.

(56) References Cited

U.S. PATENT DOCUMENTS 5,831,410 A 11/1998 Skibinski
10,168,379 B2 1/2019 Pray
2016/0041219 A1* 2/2016 Werelius ................ G01R 31/14 702/57
2018/0356456 A1* 12/2018 Schaefer ................ G01R 31/08
2023/0041663 A1* 2/2023 Qiao ...................... G01R 31/20

FOREIGN PATENT DOCUMENTS

EP 3384732 B1 4/2020

OTHER PUBLICATIONS

Translation of DE # 102015223738A1 (Year: 2015).*
"IEEE Guide for Transformer Impulse Tests—Redline", IEEE Standard, IEEE, Piscataway, NJ, USA, Mar. 9, 2012 (Mar. 9, 2012), pp. 1-146, XP017694960, ISBN: 978-0-7381-7127-2 figure 4 4,5, 10, sections 3.2, 4.1.2.4 and 4.1.3.3.

* cited by examiner

*Primary Examiner* — Christopher P Mcandrew
(74) *Attorney, Agent, or Firm* — EIP US LLP

(57) ABSTRACT

A method of operation and apparatus is provided for performing a surge test of electrical insulation of at least part of a winding under test, the winding being a winding of an electrical machine. The apparatus comprises a test device having a surge generator, at least two test connections for connecting to the test device, and a damping device comprising a resistance. The damping device is connected across the part of the winding under test, the test connections are arranged to connect a parallel combination of the damping device and the part of the winding under test to the test device and a voltage impulse is generated using the surge generator.

20 Claims, 16 Drawing Sheets

METHOD AND APPARATUS FOR PERFORMING A SURGE TEST OF ELECTRICAL INSULATION

CROSS-REFERENCE TO RELATED APPLICATIONS

This application claims the benefit of U.S. Provisional Application No. 63/555,153, filed Feb. 19, 2024, under 35 U.S.C. § 119(a). The above-referenced patent application is incorporated by reference in its entirety.

BACKGROUND

Technical Field

The present invention relates generally to a method and apparatus for performing a surge test of electrical insulation, and in particular, but not exclusively, for performing a surge test of electrical insulation of at least part of a winding of an electrical machine.

Background

Surge testing is routinely carried out on windings and coils of electrical machines. For example, a winding or a part of a winding may be subjected to high voltage (HV) impulses, which may be a voltage above 1 kV and may be 40 kV or higher, to test that it was manufactured correctly so that the HV insulation is not compromised during mechanical handling and application of various insulation layers. The rise time of a voltage impulse may be 500 ns or less, and the impulse may be generated by a surge generator which is connected by long test leads to the device under test. However, it is found that parasitic inductance and capacitance in the test set up and the device under test, typically the windings and/or coils of an electrical machine, may lead to unwanted high frequency oscillations in the test voltage applied to the device under test, which may make the test difficult to calibrate and may lead to application of voltages to the device under test that are greater than intended.

SUMMARY

In accordance with a first aspect, there is provided a method of operation of measurement apparatus for performing a surge test of electrical insulation of at least part of a winding under test, the winding being a winding of an electrical machine, the apparatus comprising a test device having a surge generator, at least two test connections for connecting to the test device, and a damping device comprising a resistance, the method comprising: connecting the damping device across the part of the winding under test, the test connections being arranged to connect a parallel combination of the damping device and the part of the winding under test to the test device; and generating a voltage impulse using the surge generator.

This method allows reduction of unwanted oscillations in the voltage applied to the electrical insulation under test, which may generate voltages greater than the intended voltage and which may make the test voltage less well defined and difficult to calibrate. The oscillations may be caused by the combination of the parasitic inductance of the test connections, typically test leads, in combination with the self-capacitance of the part of the winding under test in series with the capacitance of the test device. Arranging for the test connections to connect the parallel combination of the damping device and the part of the winding under test to the test device allows more effective damping of oscillation than if a damping device were connected at the end of the test connections nearest to the test device.

In an example, the method comprises: connecting the test connections to the part of the winding under test using a connection device, the connection device comprising the damping device and electrodes for connecting the damping device to the part of the winding under test.

In an example, the resistance of the damping device is connected across the part of the winding under test to provide a direct current connection. This allows damping of the unwanted oscillations without the use of a capacitor in the damping device in series with the resistance of the damping device, which may retain a high voltage after the test in some circumstances.

In an alternative example, the damping device comprises a resistance in series with a capacitance, the resistance in series with the capacitance being configured for connection across the part of the winding under test. The provision of a capacitance in series with the resistance limits power dissipation in the resistance, allowing a lower power device to be used to implement the resistance, and furthermore prevents the damping device from affecting any direct current tests performed by the test device.

In an example, the damping device has a fixed value of resistance. This allows the damping device to use a high power dissipation resistor, which may be able to dissipate more power than a variable resistor. Furthermore, a suitable value of resistance can be pre-configured to allow convenient and safe operation.

In an example, the damping device has a value of resistance in the range 80 Ohm to 400 Ohm, and in an alternative example, the damping device has a value of resistance in the range 8 to 40 Ohm. These examples of ranges have been found to provide a beneficial trade-off between damping characteristics and power dissipation.

The damping device may comprise a wire-wound resistor to provide high power dissipation characteristics.

In an example, the voltage impulse has a voltage value of greater than 1 kV and may be adjustable to a value of 40 kV or higher.

In an example, an inductance between the damping device and the part of the winding under test is less than an inductance of the test connections between the test device and the damping device. This arrangement provides for effective damping of unwanted oscillations.

In an example, the part of the winding under test is a pre-formed winding element.

In an example, the damping device comprises connectors adapted for connection to the test connections, providing reliable and safe connection.

In an example, the method comprises measuring a voltage across the part of the winding under test as a function of time. This allows evaluation of the characteristics of the insulation by comparison with expected values for a winding under test having satisfactory insulation.

In an example, the damping device comprises a switch in series with the resistance of the damping device, the method comprising setting the switch to a closed state to perform the surge test. This allows the damping device to be switched out of the circuit for other tests using the test device where a damping resistance is not required, such a DC insulation tests.

In an example, the damping device comprises a temperature sensing circuit, and the method comprises measuring a temperature of the damping device using the temperature sensing circuit and inhibiting the generation of the voltage impulse by the surge generator if the temperature exceeds a threshold. This provides for safe operation, for example when a series of tests is performed.

In an example, the voltage impulse is generated with a rise time to peak voltage of less than 500 ns. The damping device provides damping that operates particularly effectively for voltage impulses having this rise time.

In an example, the surge test of electrical insulation of at least part of a winding comprises a test of electrical insulation between a pair of phase windings of an electrical machine, and the test comprises tests of electrical insulation of further pairs of phase windings of the electrical machine, each pair of windings being provided with a respective damping device connected such that the resistance of the damping device is connected across the respective pair of phase windings under test. This provides for effective damping of unwanted oscillation in a three-phase test.

In accordance with a second aspect, there is provided measurement apparatus for performing a surge test of electrical insulation of at least part of a winding, the winding being a winding of an electrical machine, the apparatus comprising: a test device having a surge generator configured to generate a voltage impulse; at least two test connections for connecting to the test device; and a damping device for connection across the part of the winding under test, the damping device comprising a resistance and being configured for connection such that the test connections are arranged to connect a parallel combination of the damping device and the part of the winding under test to the test device.

In accordance with a third aspect, there is provided a test kit for performing a surge test of electrical insulation of at least part of a winding, the winding being a winding of an electrical machine, the measurement kit comprising: instructions to perform the surge test according to examples of the method disclosed herein using a test device having a surge generator configured to generate a voltage impulse; at least two test connections for connecting to the test device; and a damping device configured for connection across the part of the winding under test, the damping device being configured for connection such that a resistance of the damping device is connected across the part of the winding under test, and the test connections being configured to connect a parallel combination of the damping device and the part of the winding under test to the test device.

In accordance with a fourth aspect, there is provided a connection device for connection of test leads to at least part of a winding of an electrical machine for performing a surge test of electrical insulation of the at least part of a winding when the test leads are connected to a test device having a surge generator, wherein the connection device comprises a damping device comprising a resistance configured for connection across the part of the winding under test, the connection device being configured to connect a parallel combination of the damping device and the part of the winding under test to the test leads.

Further features and advantages will be apparent from the following description of exemplary embodiments, which are given by way of example only.

DETAILED DESCRIPTION

By way of example, embodiments will now be described in the context of measurement apparatus for performing a surge test of electrical insulation of at least part of a winding of an electrical machine, such as a generator or motor, involving generation of an impulse with a rise time typically of 500 ns or less, but it will be understood that the measurement apparatus may take other forms, and may apply to tests with lower rise times and tests of various types of insulator.

Windings of electric motors, which may also be referred to as coils, may be subjected to routine high voltage (HV) tests to prove that they were manufactured correctly so that the HV insulation is not compromised during mechanical handling and application of various insulation layers. For large motors operating at high voltage (HV), which may be a voltage above 1 kV, the windings/coils are typically made as form-wound, also called “pre-formed”. This is because windings/coils are bent into their final form from thick copper conductors, before being inserted into the stator core of the motor. HV testing of such windings/coils, and also windings/coils wound with normal wire, is prescribed by international standards such as IEC 60034-15 or IEEE 522. In particular, a “steep-rise” surge test may be specified, which is used to test turn-to-turn insulation which cannot be tested in any other way because the winding/coil constitutes effectively a short-circuit under DC conditions because of continuous copper from its one end to the other. If AC current is applied then some voltage can be induced across the winding/coil thus imposing some voltage between the subsequent turns, and therefore the turn-to-turn insulation can be tested in this way. The rise time (from start to first positive peak) of the voltage waveform may be specified as 100-200 ns (IEEE 522) or in another example 200 ns+/−100 ns (IEC 60034), so typically less than 300 ns or 0.3 us, hence the name “steep rise”.

Figure 1:
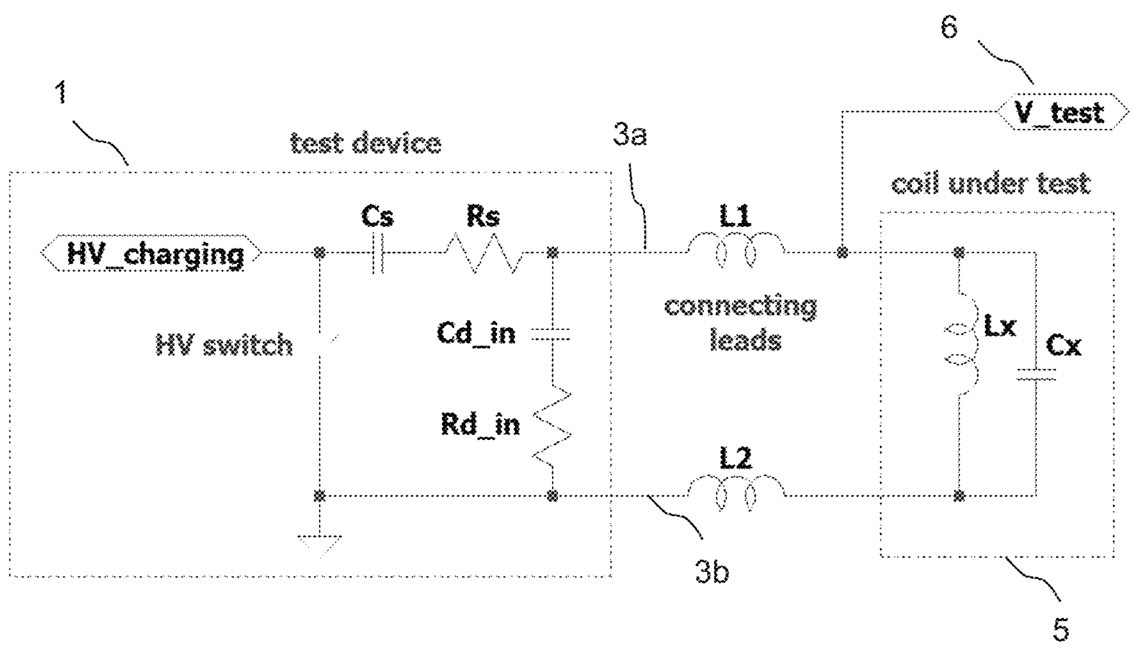
FIG. 1 is a schematic diagram showing a test device comprising a surge generator connected by test connections to at least part of a winding of an electrical machine under test, illustrating parasitic inductances leading to unwanted oscillation.

FIG. 1 is a schematic diagram showing a conventional test device 1 comprising a surge generator connected by test connections 3*a*, 3*b*, typically test leads, to at least part of a winding or coil under test 5. The characteristics of the surge generator circuit result in the impulse voltage having intentional lower frequency oscillations (lower frequency than unwanted higher frequency oscillations) resulting from the inductance Lx of the coil under test and the capacitance Cs of the power supply or the impulse generator inside the test equipment. The resonating frequency fx can be dictated for example by Cs=150 nF and Lx=100 uH, so fx=41 kHz (typically tens or hundreds of kHz).

The operation of a typical surge tester is such that the internal capacitance Cs is charged through the tested coil Lx connected in series. After obtaining sufficient test voltage in Cs, an HV switch is closed which makes the Lx-Cs tank resonate at its natural frequency, immediately imposing a steep rise in the voltage from Cs to Lx. The resonating waveform decays because of the resistive losses in the circuit.

After each impulse Cs is discharged and the process repeats. Cs can be charged to any voltage within the range of the test equipment, for example from 50 V to 40 kV and higher. This allows adjusting the test voltage to the required voltage rating of the coil-under-test. The HV charging circuit, with Cs, and the HV switch forms the basic impulse generator (or power supply). The device can be operated from mains or from battery.

It has been found according to this disclosure that there are several parasitic values which affect operation during such surge test, as illustrated in FIG. 1. The connecting leads 3*a*, 3*b*. i.e. the test connections, have inductances L1, L2 which develop some voltage drop across them during the impulse of the applied test current. The winding/coil under test 5 Lx may have significant self-capacitance Cx (typically tens or hundreds of pF). Also, the tester may have a current-limiting resistor Rs to protect the components against discharging into a very low-impedance short circuit. Other short-circuit current-limiting solutions can be also used, such as built-in inductance.

The tester, i.e. the test device 1, may also have an additional internal damping branch Rd_in+Cd_in to ensure that the main oscillations decay in a controlled way. There can be many more other components, arranged in different ways, or provided by parasitics (such as lead resistance) rather than by bespoke components, but the concepts are similar. These additional components and parasitics would not cause substantially different behaviour of the waveforms.

In the circuit as shown in FIG. 1 there are at least two separate L-C tanks, each resonating at a different frequency. The first is formed by the main HV capacitor Cs together with the combined inductance Lx+L1+L2. These values are higher and therefore the resonating frequency is lower (tens or hundreds of kHz).

The second LC tank is formed by Cs in series with Cx, and because this is connection in series then the resulting value is smaller than Cx (and much smaller than Cs). The L in this tank is formed mainly by L1+L2 which is typically smaller than Lx. Therefore, the resulting (unwanted) resonating frequency is higher, and it is superimposed on the slower frequency.

As an example, for Cs=150 nF, Lx=100 uH, Cx=300 pF, and L1=L2=5 uH results in the slower resonating frequency (Cs/Lx+L1+L2) similar to the previous simplistic case as fx=39 kHz, but the faster unwanted parasitic frequency (Cx+Cs/L1+L2) which is practically the same as (Cx/L1+L2) as fp=2.9 MHz.

This high frequency oscillation is detrimental because it makes the test voltage less defined. This creates problems during calibration of the equipment as well as the actual performance because the amplitude and frequency of the oscillation depends mostly on the typically unknown value of Cx, which can vary greatly between windings/coils of different designs. The high-frequency oscillations are superimposed on top of the wanted waveform. As a result, much higher peak voltage can be presented across the insulation, which can be damaging to that insulation.

Figure 2:
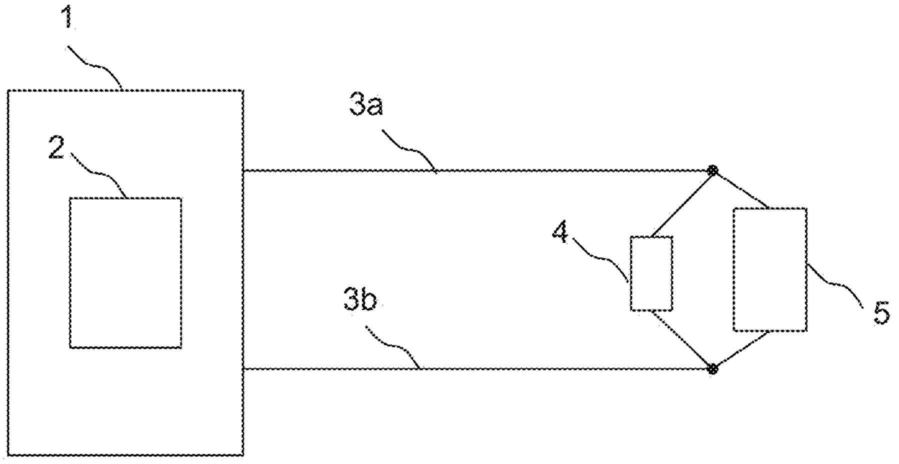
FIG. 2 is a schematic diagram illustrating an example of test device comprising a surge generator connected by test connections to at least part of a winding under test, with a damping device connected across the at least part of the winding according to this disclosure to suppress unwanted oscillation.

FIG. 2 shows a solution to the problem of the unwanted oscillation according to this disclosure. A test device 1 has a surge generator 2, and at least two test connections 3*a*, 3*b*, in this example test leads, to connect the test device 1 to the part of the winding under test 5. Test leads are typically insulated flexible test wires, which may have a suitable connector at one end, such as a plug, for connection to the test device. The test connections may have a suitable connector at the other end for connection to the winding under test, such as a clip. In another example, the test connections 3*a*, 3*b* may be connected to the winding under test via a connection device, into which the connection leads 3*a*, 3*b* may be plugged. The connection device may be, for example, an electrically insulated handle having electrodes to be placed onto a device under test.

A damping device 4 comprising a resistance is connected across the part of the winding under test 5. The test connections 3*a*, 3*b* are arranged to connect a parallel combination of the damping device 4 and the part of the winding under test 5 to the test device 1. In operation, a voltage impulse is generated using the surge generator 2. The damping device damps the unwanted oscillations in the voltage applied to the electrical insulation under test, i.e. the part of the winding under test 5, caused by the parasitic inductance of the test leads in combination with the self-capacitance of the part of the winding under test and the capacitance of the test device 1. Connecting the damping device at the far ends of the test connections 3*a*, 3*b*, at the ends away from the test device 1, has been found to provide, according to this disclosure, more effective damping than could be provided by a damping device connected at the ends of the test leads close to the test device 1. This is because the inductance of the test connections, would reduce the effectiveness of a damping device if it were connected across the test leads next to the test device. In an example, the test connections between the test device and the winding under test may be at least 5 times longer, and typically 10 or more times longer, than a connection between the damping device and the winding under test. A longer connection typically has a higher parasitic, that is to say unintended, inductance than a shorter connection.

Figures 3A, 3B, 3C:
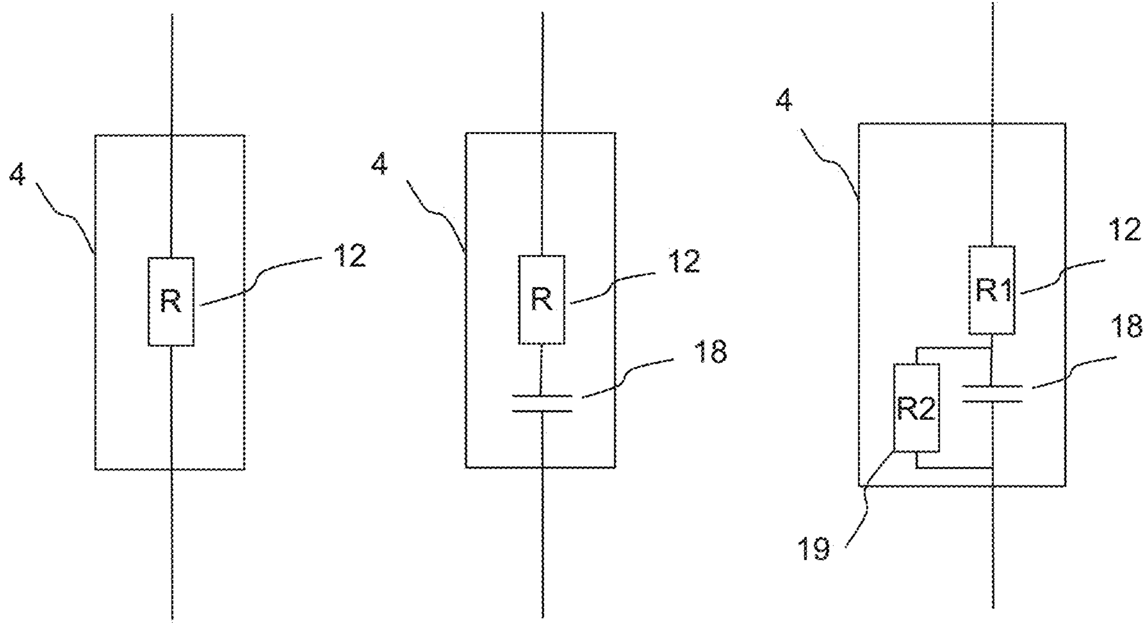
FIG. 3*a* is a schematic diagram showing a first example of a damping device, comprising a resistance for connection directly across a part of a winding under test.
FIG. 3*b* is a schematic diagram showing a second example of a damping device, comprising a resistance in series with a capacitance.
FIG. 3*c* is a schematic diagram showing a third example of a damping device, comprising a resistance in series with a parallel arrangement of a capacitance and a by-pass resistor.

FIG. 3*a* is a schematic diagram showing a first example of a damping device 4, comprising a resistance 12 for connection directly across a part of a winding under test. The resistance 12 may consist of a single resistor or may be a parallel or series combination of resistors, or any other form of resistive device. In this first example, the direct current connection is made without use of a series capacitor in the damping device, the damping device 4 being connected such that the resistance 12 of the damping device 4 is connected across the part of the winding under test 5 to provide a direct current connection. In the example of FIG. 3*a*, no series capacitance is provided in series with the resistance 12. It has been found that in some circumstances a series capacitance may present a safety hazard to an operator, as it may retain a high voltage after the test, and it has been found that satisfactory power dissipation can be achieved without the series capacitor, providing benefits in terms of safety to an operator in some circumstances.

In an alternative, second, example, as illustrated by FIG. 3*b*, the damping device 4 is equipped with a capacitance 18 in series with a resistance 12, that is to say a resistive component. The capacitance 18 in series with the resistance 12 of the damping device 4 limits power dissipation in the damping device during the surge test, which may become significant, in particular for a series of surge tests. The capacitance may be provided by a single capacitor, or by a series or by a parallel combination of capacitors, or by any other capacitive device. In addition, the use of a series capacitance 18 prevents the resistance 12 from affecting any direct current tests that may be conducted by the test device 1, such as for example tests of resistance of the device under test.

In a third example of a damping device, as illustrated by FIG. 3*c*, the damping device comprises a resistance 12 in series with a parallel arrangement of capacitance 18 and a by-pass resistor 19. The by-pass resistor 19 may be of a higher value than the first resistance 18, for example by a factor of 100 or more, and serves to discharge the capacitance 12 to dissipate potentially hazardous voltages that may remain after a test. The high value of the by-pass resistance, typically greater than 100 kOhm and less than 1 MOhm, may avoid significant affects on DC tests of the device under test. The by-pass resistor may be a combination of more than one resistive device.

Figure 4:
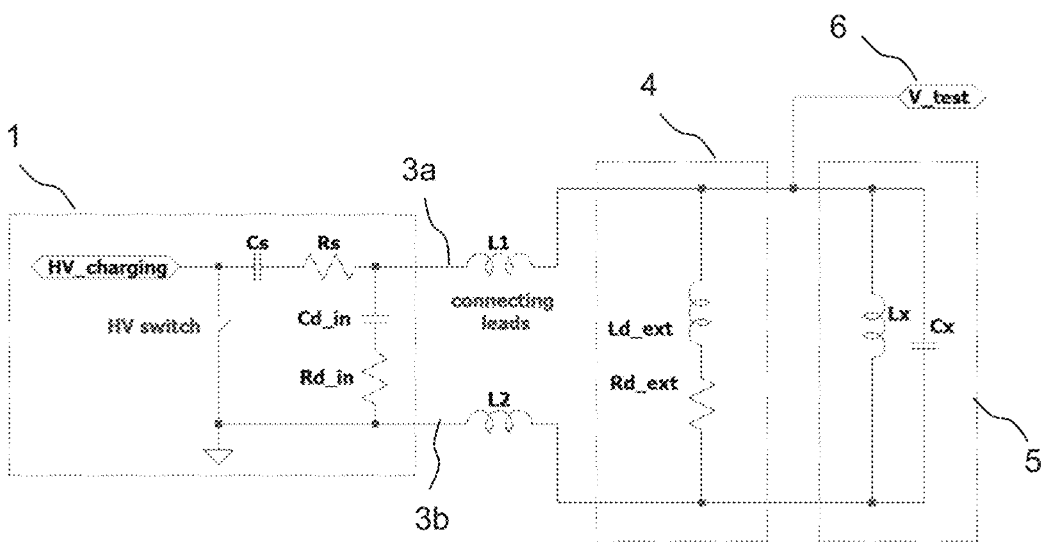
FIG. 4 is a schematic diagram illustrating parasitic inductance and capacitance of the arrangement of FIG. 2, for a damping device according to FIG. 3*a*, and a test point for a measurement of voltage across the device under test.

FIG. 4 is a schematic diagram illustrating parasitic inductance and capacitance of the arrangement of FIG. 2, for the first example of damping device as shown in FIG. 3*a*. This shows the damping device 4, which may, for example, be a dedicated external high-voltage damping circuit in the form of a suitable high-voltage high-power resistor connected via connecting leads directly across the terminals of the winding under test 5.

The damping device 4, in any of the examples as shown in FIGS. 3*a*, 3*b* and 3*c*, may also be referred to as the external HV damper, a resistive damper, a damper or a resistive device, for example.

In an example of a damping device 4, comprising a resistance 12 for connection directly across a part of a winding under test to give a direct current connection, the damping device 4 has a minimum of one equivalent resistor (or resistance) Rd_ext (in the form of an actual resistor, or parasitic resistance of the conductor), whose resistive impedance may be as required to achieve critical damping of LC circuit as dictated by the parasitic circuit described above. For typical form-wound coils a suitable value of Rd_ext would be at the order of tens or hundreds of Q.

For the same example values as described above, Cs=150 nF, Lx=100 uH, Cx=300 pF, and L1=L2=5 uH, the characteristic impedance of L1+L2 and Cx (neglecting the influence of Cs and Rs) can be calculated as $\sqrt{(L/C)}$=183Ω, so Rd_ext should have a similar value in this example.

Figure 5:
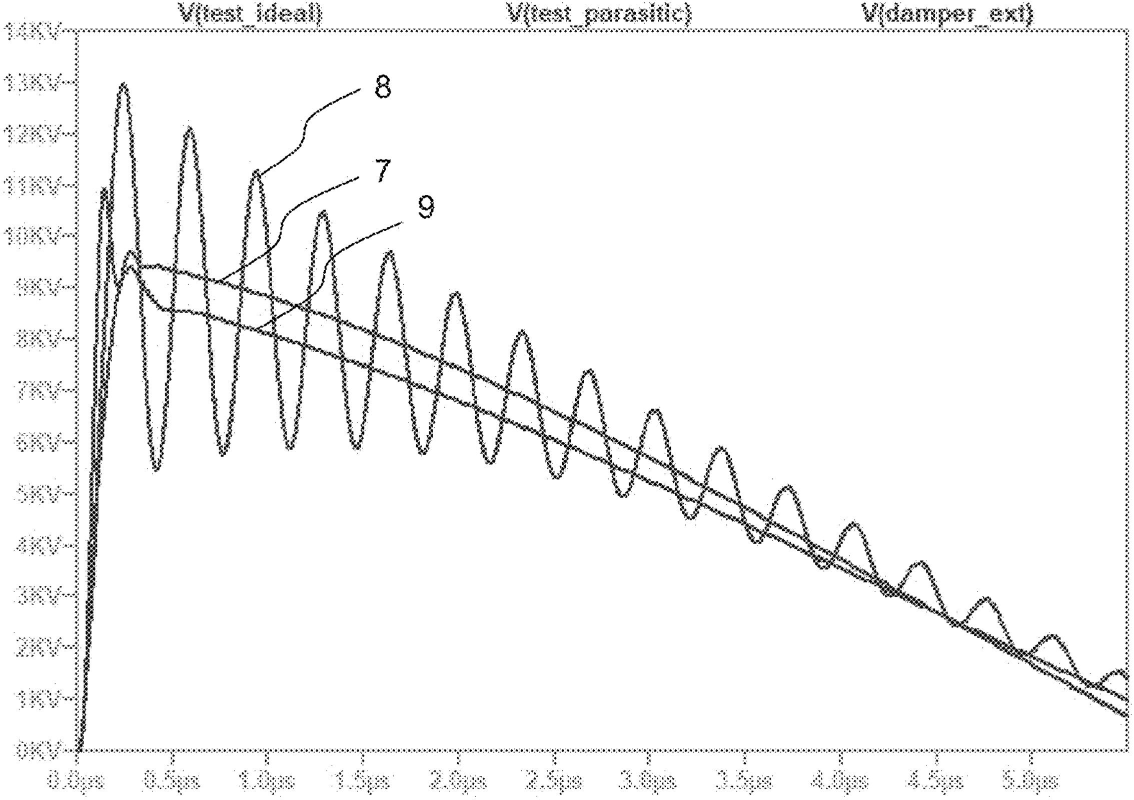
FIG. 5 illustrates voltage generated across the device under test as a function of time at the test point, for an ideal test curve, a curve with unwanted oscillation due to the parasitic components without the damping device in place, and a damped curve with the damping device connected across the device under test.

FIG. 5 shows performance for three circuits: ideal without parasitics and without the damper (that is to say without the damping device 4) as trace 7, trace 8 with parasitics without the damper 4, and as trace 9 with parasitics and with a damping device 4 of the first example, without a series capacitor, having a resistance of 183 Ω in this example. In other examples, a resistance in the ranges 8-40 Ohms and 80-400 Ohms have been found to be effective. As can be seen the high-frequency oscillations are suppressed in curve 9, without the low-frequency oscillation being affected significantly apart from a small change in amplitude and even smaller change in frequency.

Figure 6:
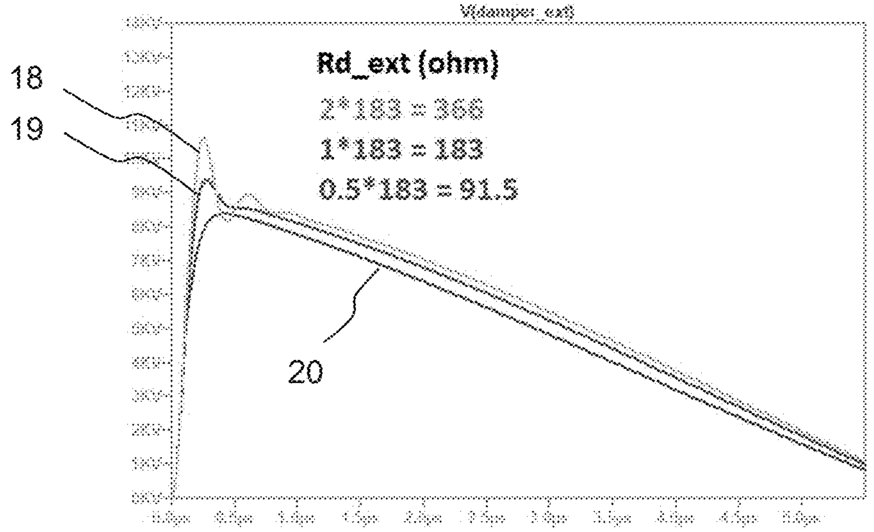
FIG. 6 shows damping responses for 3 values of resistance in the damping device.

FIG. 6 shows expected performance for a winding under test having satisfactory insulation as intended. A test may comprise measuring a voltage across the part of the winding under test as a function of time. This allows evaluation of the characteristics of the insulation by comparison with expected values for a winding under test having satisfactory insulation. If the measured value deviates from the expected value by more than a predetermined result, the insulation may be deemed unsatisfactory.

The circuit of FIG. 4 includes the internal damping circuit Cd_in+Rd_in in the test device 1 which contributes somewhat to damping the unwanted high-frequency oscillations. However, after the HV switch is closed (i.e. during the surge impulse) this internal RC branch is connected in parallel with the Cs+Rs branch which has much lower impedance (Cs+Rs in series, typically less than 20 Ω at 3 MHz) and thus the internal damping branch is ineffective at damping these high-frequency oscillations, because the addition of Rd_in=150Ω in parallel to 20Ω (or less) of Rs+Cs makes very little difference. So it is not really possible to suppress these oscillations by any circuitry which is internal to the surge tester (i.e. installed before the test leads 3*a*, 3*b*). The proposed damper/damping device 4 is external to the test device because it is typically positioned near the coil-under-test, so that appropriate damping resistance is presented directly across the smaller capacitance Cx which dictates the capacitive impedance in that circuit (at frequency fp). In other words, the damper 4 has to be external from the viewpoint of the surge tester, as no internal damper (such as Rd_in) would be effective to the same level. However, such an external damping device 4, with or without a series capacitor, could be built into the test leads and thus does not have to be a standalone external component as such. Alternatively, in particular with shorter test leads, this damper (damping device 4) may be incorporated inside the surge tester enclosure. The damper 4 would be external in the electrical sense, because the connections would have to be made at the far end of the test leads (near the tested winding), but the resistor of the damping device 4 could be positioned inside the main instrument, i.e the test device.

FIG. 6 shows performance of the damping device 4 for the same coil-under-test as in FIG. 4, but with three different values of Rd_ext used in the same circuit, with otherwise the same parasitics; 366 Ohm 18, 183 Ohm 19 and 91.5 Ohm 20, again without a series capacitor.

It is evident from FIG. 6 that Rd_ext does not have to be exactly equal to the characteristic impedance of the resonating parasitic LC tank (183Ω), but in this example it can vary from about half (91.5Ω) to twice its value (366Ω) and still achieve significant damping performance, despite Rd_ext varying by a factor of 4.

Figure 7:
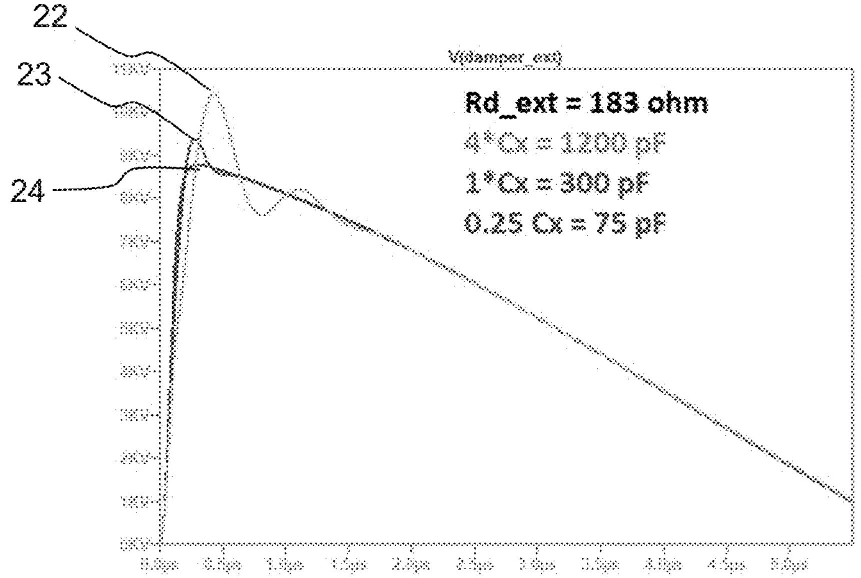
FIG. 7 shows damping curves for 3 values of parasitic capacitance and R=183 Ohms.

Moreover, the main test lead inductive impedance L1+L2 has a limited range of values in practice, for a given surge tester, so the main variable is the parasitic capacitance Cx, which is generally unknown, but it is problematic if it has a value of hundreds of pF. But the characteristic impedance is proportional to square root $\sqrt{(L/C)}$, so a fixed value of Rd_ext could easily cover wide variations of Cx by a factor as large as 16 (or even more), because $\sqrt{16}=4$, as shown in FIG. 6. FIG. 7 shows damping curves for 3 values of parasitic capacitance and R=183 Ohms; 1200 pF 22, 300 pF 23 and 75 pF 24.

Figure 8A:
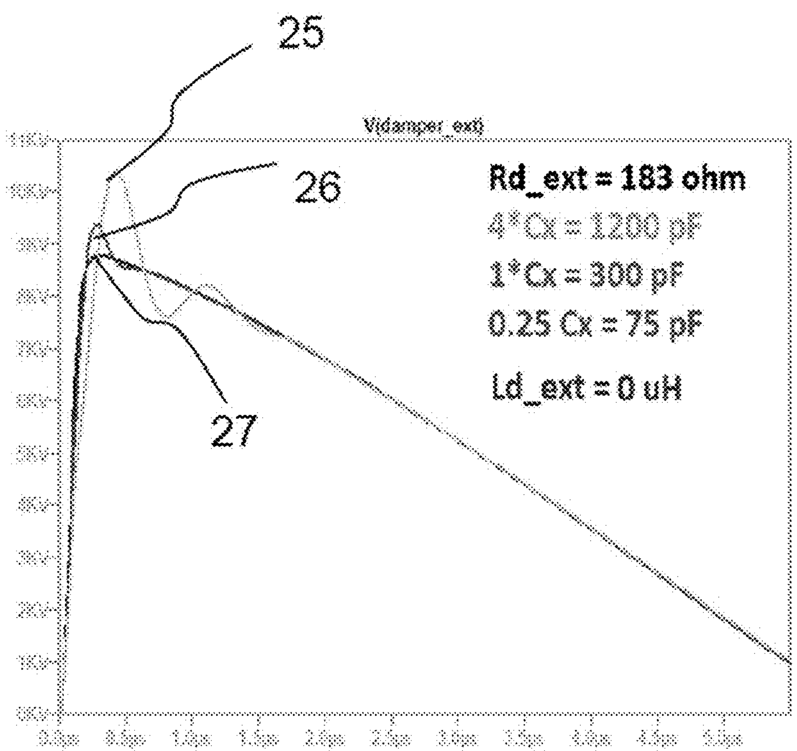
FIG. 8*a* shows damping curves for Ld_ext=0 uH for three values of parasitic capacitance.
Figure 8B:
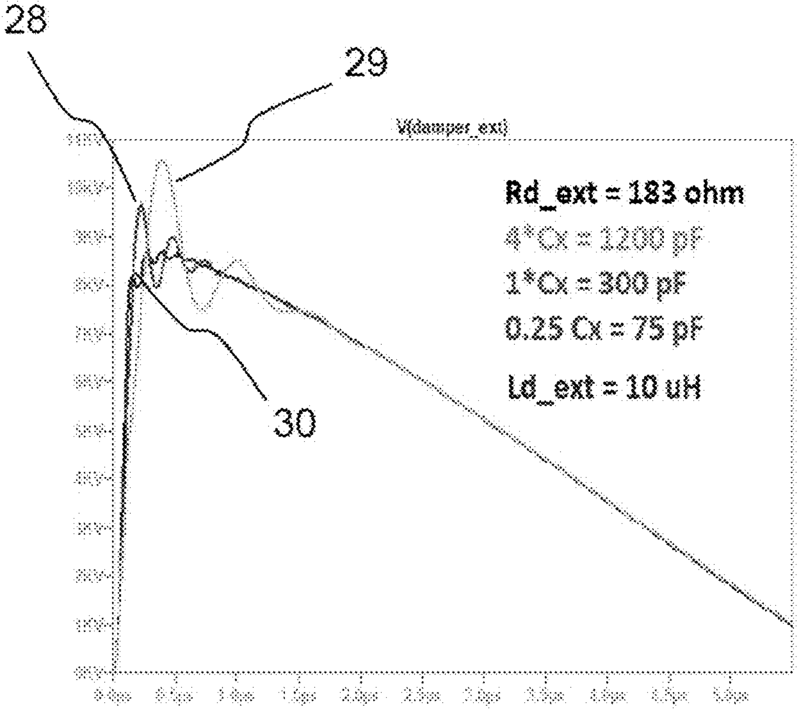
FIG. 8*b* shows damping curves for Ld_ext=10 uH for three values of parasitic capacitance.

FIGS. 8*a* and 8*b* illustrate the effects of parasitic inductance. Any piece of wire has some inductance associated with it. In fact the leads connecting the surge tester to the coil-under-test, that is to say the test connections 3*a*, 3*b* connecting to the part of the winding under test 5, which may be up to 5 m in length or longer, are straight pieces of wire or cable, not coiled under normal use. However, at for example 5 m length they contribute to around 5 uH of inductance each, and they form the main inductive component in the high-frequency resonating LC tank Cx/L1+L2. The damping device, i.e. damping device 4, may be connected across the coil-under-test, that is to say the part of the winding under test, by some additional leads, which will have their own parasitic inductance. However, these additional leads, which may be provided as part of the damping device 4, can be significantly shorter than the test connections 3*a*, 3*b*, because they need to span only across the ends of the winding/coil, which may be much closer to each other than the distance from the test device to the winding under test, typically each additional lead may be less than 1 m in length. In an example, the test connections, in this example test leads, may be more than 5 times as long, and may be 10 times or more as long, as leads provided to connect the damping device to the winding under test.

If the resonating fast frequency is at around 2.9 MHz (generally at the range of 0.5 MHz upwards) and the resistance to be achieved is around 183Ω, then the parasitic inductance of the damping device 4 (damper resistor) can have a significant value as such, but it will be still sufficient if the impedance of Ld_ext is comparable or lower (at the frequency to be damped) than the resistive component Rd_ext for significant damping to take place. So even with Ld_ext=10 uH, which is the same as L1+L2=10 uH, the damping is still achieved as shown in FIG. 8*b*. This is because at 2.9 MHz inductance of 10 uH is equivalent to 183Ω, so the resistive component is still large enough to be useful for damping, and for any lower inductance the resistive component will dominate.

FIG. 8*a* shows damping curves for Ld_ext=0 uH for three values of parasitic capacitance: 1200 pF 25, 300 pF 26, 75 pF 27. FIG. 8*b* shows damping curves for Ld_ext=10 uH for three values of parasitic capacitance: 1200 pF 29, 300 pF 28, 75 pF 30.

This is a markedly different effect than if the internal damper, internal to the test device 1, is used, which provides no significant damping effect with the same resistive values. Much smaller resistive value of the internal damper would have to be used, which would be prohibitive from power dissipation viewpoint (as explained below).

Preferably, the external damping resistor (damping device 4) should be made as a non-inductive type, such as for example a Ayrton-Perry type of winding, so that low inductance is achieved not only from the length and construction of its test leads, but also from the internal construction of the resistor. However, even if there is some parasitic inductance this can be still acceptable in practice.

Regarding voltage rating, depending on the design of a given surge tester, the tests can be applied from voltages of around 1 kV to 15 kV to 40 kV, and even to 60 kV, 80 kV, or 100 kV. Because the damping resistor may be connected directly to the voltage under test, it must be also able to withstand such voltage for repeated use.

The construction of such resistor may provide sufficiently large distances between its terminals so that the voltage does not flash over the length of the body. Alternatively, solid insulation can be provided around all the terminals to eliminate this problem. This would need to be designed and made to sufficiently high quality so that local partial discharge due to HV is avoided.

Peak power is an important requirement for the HV damping resistor, i.e. the damping device 4, in the first example without a series capacitance. Even at the bottom of the range the peak power is significant, but this goes to very high values for higher voltages. Assuming 200Ω damping resistor, we get the peak power as:

1 kV, 5 A, 0.005 MW (mega-watt)
4 kV, 20 A, 0.08 MW
15 kV, 75 A, 1.1 MW
40 kV, 200 A, 8 MW
60 kV, 300 A, 18 MW
80 kV, 400 A, 32 MW
100 kV, 500 A, 50 MW The dissipated power depends on the value of the damping resistor and thus can vary by a large factor as well. However, assuming a slightly larger value of 300Ω at 4 kV gives 53 kW or 0.05 MW, so this would be the minimum that such resistor needs to handle for the low-performance surge tester. But as listed above, this could be more than 1 MW for higher voltages.

Regarding continuous power rating, each applied surge impulse requires the high voltage to be recharged across the HV capacitor Cs, so impulses are applied at some repetition rate for example 5 pulses/sec or 1 pulse/sec.

Assuming the least demanding condition of 1 pulse/sec and that all the significant power will be dissipated within the first quarter of the cycle of around 5 us, the continuous power will be lower than the peak power by the factor of 1 s/5 us=200 000×.

So for the 40 kV device the 8 MW peak rating would become 40 W of continuous rating for the impulses applied every 1 sec. If the repetition rate is 5 pulse/sec then we get 200 W, and for repetition of 100 pulse/sec it is 4 kW of continuous power.

But for a low-end device, 4 kV at 1 pulse/sec with 300Ω damping resistor gives a very small value of less than 0.3 W of continuous power, but at 15 kV it is more than 3 W.

Continuous power rating can be reduced by using a capacitance, which may be provided by a capacitor, in series with the damping resistor, as in the second example of the damping device 4 as illustrated by FIG. 3*b*. This is because the lower frequency will be coupled to a lesser extent which will lower the power dissipation in the resistor over longer time due to the slower oscillations. However, it has been realised that in some circumstances it may be safer not to have any capacitive components which could remain charged and thus dangerous to the operator. It is therefore, in some circumstances, beneficial not to have any such series capacitance, at the expense of increased power dissipation in the damper resistor.

It may also be beneficial in some circumstances to omit a series capacitor to avoid limiting the rise time of the voltage impulse generated by the surge generator. The applied surge impulse must have "steep rise", typically below 300 ns (depending on the standard). As shown in FIG. 5 with the resistive damper the rise time is not impacted in a significant way. However, additional capacitance (parasitic or not) added in parallel to the coil-under-test may have negative impact on the rise time.

As has been described, the use of the damping device 4, with or without a series capacitor, as an external HV damper, outside the test device having the surge generator, and deployed at or near the ends of test leads away from the test device and closest to a winding or part of a winding under test under test has several advantages, some of which may be summarised as follows. Unwanted high-frequency oscillations can be completely or significantly suppressed. Uncontrolled fast peak overvoltage can be completely or significantly suppressed so that much better control of the test voltage (peak voltage) is achieved. The amplitude of the wanted slower frequency is affected in a negligible way, and if necessary this can be accounted for during calibration of the device. The frequency of the wanted slower frequency is affected in a negligible way which can be completely ignored in practice. A fixed single value of "external" damping resistor can cover wide changes of the parasitic capacitance Cx because of the √ relationship. Voltage range for the damping resistor-minimum 1 kV peak of the applied test voltage, but with the maximum extending to 3 kV, 4 kV, 6 kV, 12 kV, 15 kV, 40 kV, 80 kV, or even 100 kV. This can be achieved by using several resistors in parallel/series, which are connected together permanently or temporarily. In the first example of damping device without a series capacitance, peak power rating for the damping resistor may be in an example at least 0.03 MW of peak power (500 Ω, 4 kV), or 0.45 MW at 15 kV, or 3 MW for 40 kV operation and continuous power rating for the damping resistor may be, in an example, at least 40 W for 40 kV surge tester. Several such damping resistors can be connected in parallel or series to obtain heavier or lighter damping, as dictated by the parasitics of a given setup, but at least one resistive component (explicit or parasitic) is required. Damping resistance can be provided by a dedicated resistor, as well as via parasitic resistance of a wire. The parasitic inductive component of impedance of the damping circuit should be comparable or smaller than its resistive impedance, in order to provide the required damping performance. The parasitic inductive component of impedance of the damping circuit should be comparable or smaller than the inductive impedance of the main test leads. Examples can be used as a single-phase circuit (just two leads, across one tested coil), as well as a three-phase variant having either three separate damping devices connected as star or delta, or a single combined damping device pre-wired in a specific configuration, with three test leads. Rise time is not impacted in a significant way, so that 300 ns (or less) can be achieved with such damping devices.

In an example, the HV damper, i.e. damping device 4, may be provided just as a resistor with leads and clips so that it can be connected parallel to the coil under test, that is to say the part of the winding under test. This could be standalone accessory which could be added as and when needed, which would also allow connecting two (or more) such dampers to be used in parallel or series, or in any other configuration, to achieve the desired level of damping, as dictated by the parasitics, that is to say inductances and capacitances.

Figure 9:
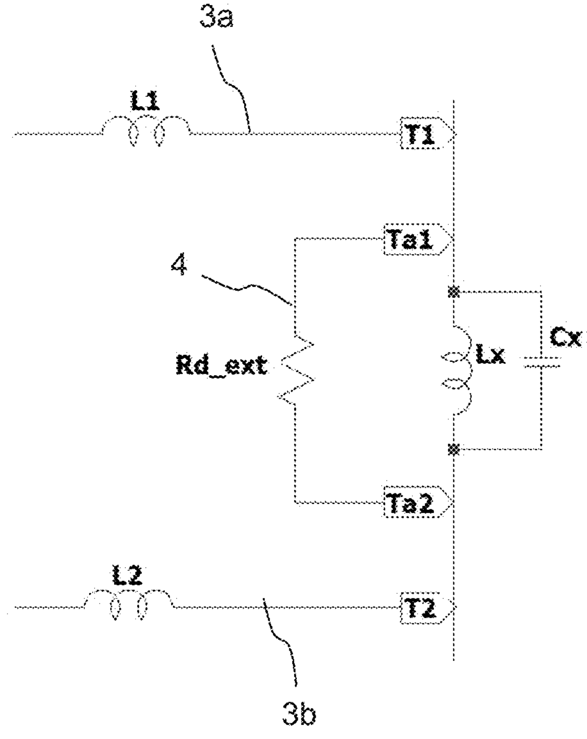
FIG. 9 shows a schematic representation of a standalone damping device that can be connected across a device under test.
Figure 10:
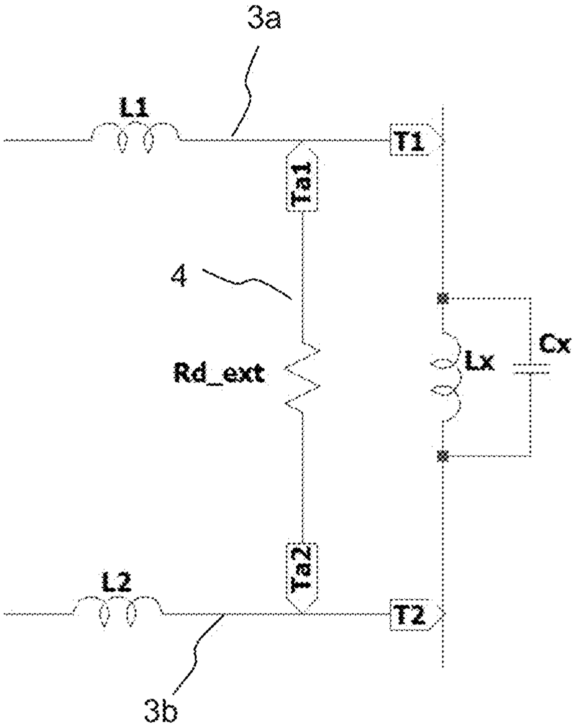
FIG. 10 shows a schematic representation of a damping device that is adapted to be pluggable into the test leads.
Figure 11:
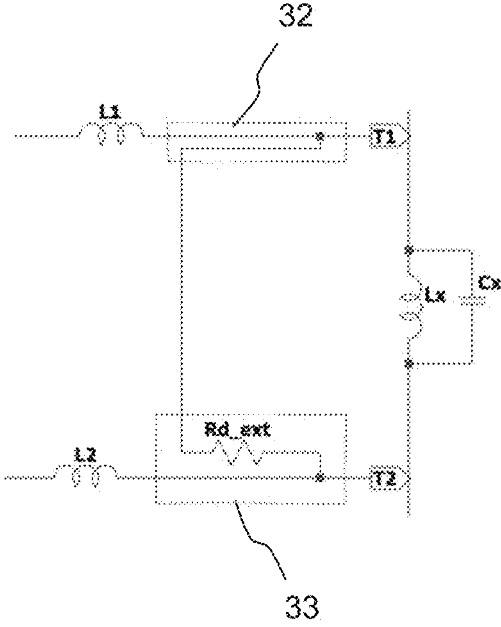
FIG. 11 shows a schematic representation of a damping device and connections built into the test leads

The damping device 4 can be a separate standalone component as shown in FIG. 9 or connectable/pluggable into the main leads as shown by FIG. 10, by any suitable electrical and mechanical connection (plug/socket, crocodile clip, etc.). It may be also built into the test leads 32, 33 in such a way that there will be a connection joining the two in a permanent way (electrically), and the resistor may be incorporated mechanically into one of the test leads 33 as shown in FIG. 11.

The operation of the surge supply circuit can be performed in many different ways, with the surge switch being mechanical, uncontrolled or triggered spark gap, relay (gas, vacuum, oil-filled) transistor or thyristor based, using any suitable type of HV switch, mechanical, solid state, etc.) The output voltage could be unipolar or bipolar, coupled via transformer, etc. This would not affect operation of the damper circuit.

Figure 12:
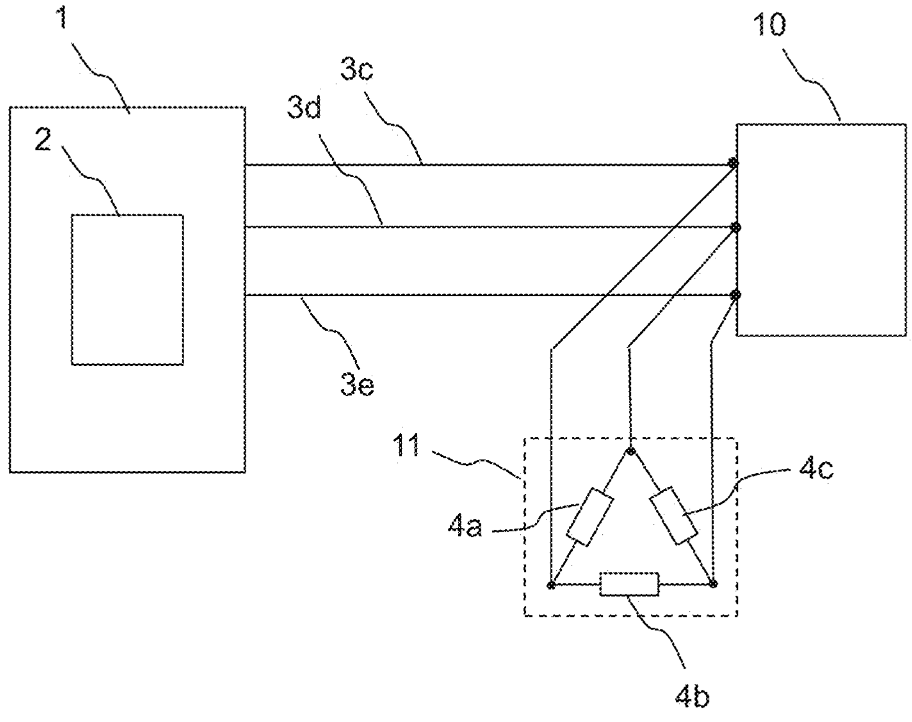
FIG. 12 shows a test arrangement for testing the windings of a three phase machine.

FIG. 12 shows a test arrangement for testing the windings of a three phase machine or a three phase winding 10. In an example, the surge test of electrical insulation of at least part of a winding of the electrical machine comprises a test of electrical insulation between a pair of phase windings of the electrical machine, and the test comprises tests of electrical insulation of further pairs of phase windings of the electrical machine, each pair of windings being provided with a respective damping device 4*a*, 4*b*, 4*c* connected such that the resistance of the damping device is connected across the respective pair of phase windings under test. This provides for effective damping of unwanted oscillation in a three-phase test. Three test leads 3*c*, 3*d* 3*e* are provided for connection to the three phase inputs of the machine 10. For three-phase testing the damping devices 4*a*, 4*b*, 4*c* might be switched in or out automatically by a surge test circuit of the test device 1, as required. In an example, the damping device may provide a direct current connection, and in an alternative example, the damping device may have a capacitance in series with the resistance.

Figure 13:
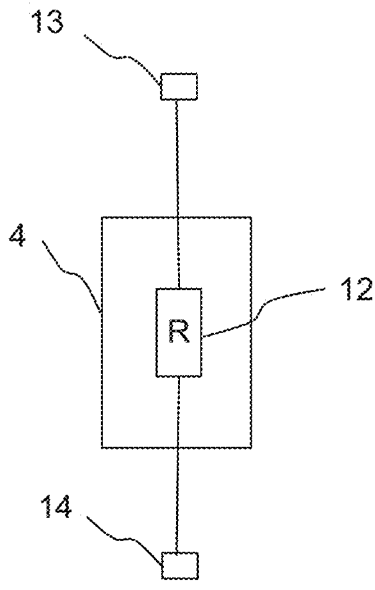
FIG. 13 illustrates a damping device comprising a resistor.

FIG. 13 illustrates a damping device 4 comprising a resistor 12 and connection leads having end connections 13, 14 adapted for connection to the test leads 3*a*, 3*b*, for example by provision of plugs for connection to sockets provided in the test leads 3*a*, 3*b*.

Figure 14:
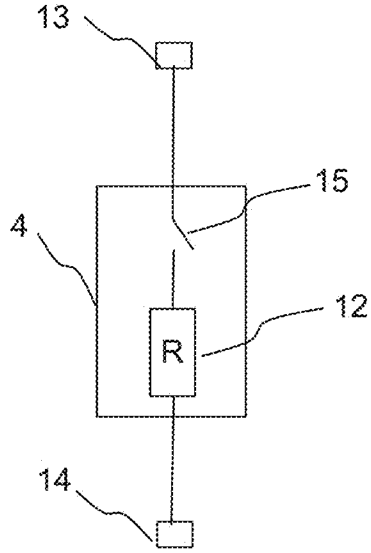
FIG. 14 illustrates a damping device comprising a resistor and a switch.

FIG. 14 illustrates a damping device 4 comprising a resistor 12 and a switch 15. The switch may be a high-voltage switch (mechanical or solid state) which may be set to a closed or open position, for example under control of a processor, for example in the test device 1, controlling a measurement. The closed position facilitates the damping operation of the damping device 4. The open position would allow use of the same main connecting leads to carry out other tests for which the damping is not required (such as DC insulation testing, inductance, resistance, etc.).

For example in a configuration where the damping device is built into one of the test leads, as in FIG. 10, the damping device 4 comprises a switch in series with the resistance of the damping device, and the method comprises setting the switch to a closed state to perform the surge test. This allows the damping device 4 to be switched out of the circuit for other tests using the test device where a damping resistance is not required, such a DC insulation tests.

Figure 15:
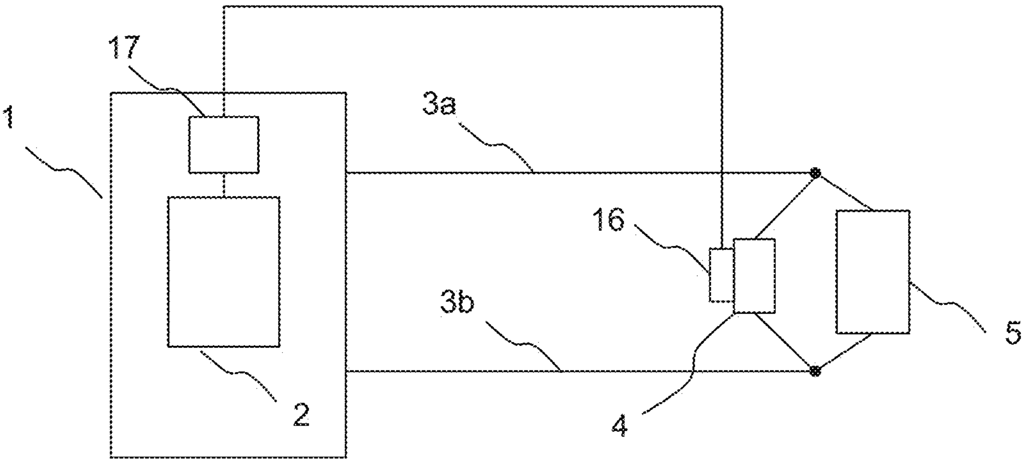
FIG. 15 illustrates a damping device having a temperature sensor connected to a control processor of the test device.

FIG. 15 illustrates a damping device having a temperature sensing circuit 16 connected to a control processor 17 of the test device 1. The temperature sensing circuit, for example comprising a thermistor or a thermocouple, may send information (wired or wirelessly) to the main unit to stop the testing in case of overheating. Natural or forced cooling could be used for the damping device 4. In an example, the damping device 4 comprises the temperature sensing circuit 16, and the method comprises measuring a temperature of the damping device using the temperature sensing circuit and inhibiting the generation of the voltage impulse by the surge generator if the temperature exceeds a threshold. This provides for safe operation, for example when a series of tests is performed. The temperature sensor may be placed on or near to a resistive element of the damping device 4, so as to sense the temperature of the resistive element, such a resistor, and for example a wire-wound resistor.

In an example, the damping device has a fixed value of resistance. This allows the damping device to use a high power dissipation resistor, which may be able to dissipate more power than a variable resistor. Furthermore, a suitable value of resistance can be pre-configured to allow convenient and safe operation.

In a variant, the damping resistors can have adjustable values, either continuously, or by connecting different taps.

Figure 16:
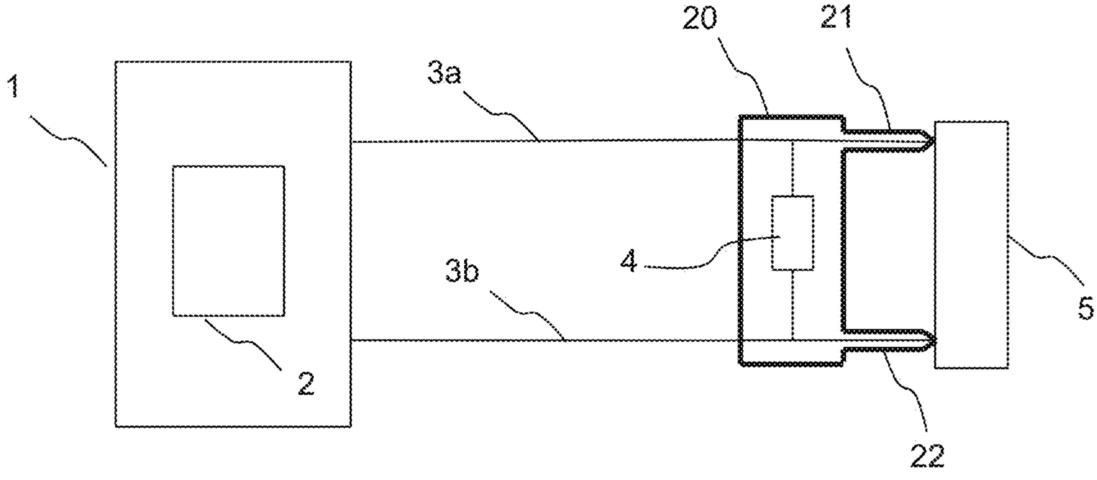
FIG. 16 is a schematic diagram showing a connection device comprising a damping device and clips for connection to a device under test, the connection device being at the far end of test connections connecting it to a test device.

FIG. 16 is a schematic diagram showing a connection device 20 for connecting test connections 3*a*, 3*b*, typically test leads to a device under test, such as windings or parts of windings. The connection device may be in the form of a handle with electrodes that can be used as probes to contact to a device under test. The connection device may be designed to be hand-held, so that a device under test may be probed. For example, the electrodes may be placed onto the commutator of a motor or generator, so that windings or parts of windings that are connected to the commutator may be tested. The connection device 20 comprises a damping device 4 and electrodes 21, 22 for connection to a device under test 5. The connection device is for connection at the far end of test connections 3*a*, 3*b* from a test device 1 comprising a surge generator 2. The connection device may have suitable connectors, such as sockets, to which the test leads, 3*a*, 3*b* or test connections, may be connected. The electrodes are configured for connection of the damping device and the test leads to at least part of the winding, the test leads and damping device being connected across the part of the winding under test. The damping device may comprise a resistance in series with a capacitance, the resistance in series with the capacitance being configured for connection across the at least part of the winding.

The test device 1 may comprise an internal transformer for connection between the surge generator 2 and the test connections 3*a*, 3*b*. Alternatively, the transformer may be external to the main body of the test device 1, and operates as part of the test device 1, albeit being external to the main body of the test device 1.

In an example, the damping device 4 incorporated in the connection device 20 is of the second example, having a resistance and capacitance in series.

In a specific example, the surge generator provides 2 provides a voltage of 12-15 kV, which is converted into a lower voltage by a transformer, providing a higher current output than would be the case without the transformer. In this case, it has been found that a relatively low value of resistance in the damping device provides effective damping, for example in the range 8-40 Ohm, with the specific example of 15 Ohm being found to provide effective damping. In an example, the resistance is provided by an arrangement of four 15 Ohm resistors, provided as a series arrangement of two parallel arrangements of 15 Ohm resistors, providing a resistance of 15 Ohms in total. In this example, the capacitance is provided by parallel combination of five 0.01 microFarad capacitors, each rated at 2 kV, providing 0.05 microFarad capacitance in total. It has been found, in an example, that a value of capacitance in the range 0.01-0.1 microFarad provides effective damping. The in-series capacitor is particularly beneficial with the relatively low resistance value, for example 15 Ohm, because this prevents the parallel resistance of the damper device affecting the measurement of a resistance of the load of the device under test. By introducing the capacitor the direct DC path is broken and thus the load resistance measurement would not be affected.

In another specific example, the surge generator provides a voltage of up to 40 kV or up to 80 kV, and a transformer is not used between the surge generator 2 and the test connections 3*a*, 3*b*. In this case, it has been found that a higher value of resistance in the damping device provides effective damping, for example in the range 100-150 Ohm, and in an example 80-400 Ohm. The value of the damping resistor is related to the load and voltage level, with the aim of critical damping of oscillations due to LC parasitic components (lumped or distributed). An example of the damping effect as a function of resistance value is shown in FIG. 6, for a surge generator without a series transformer.

Figure 17:
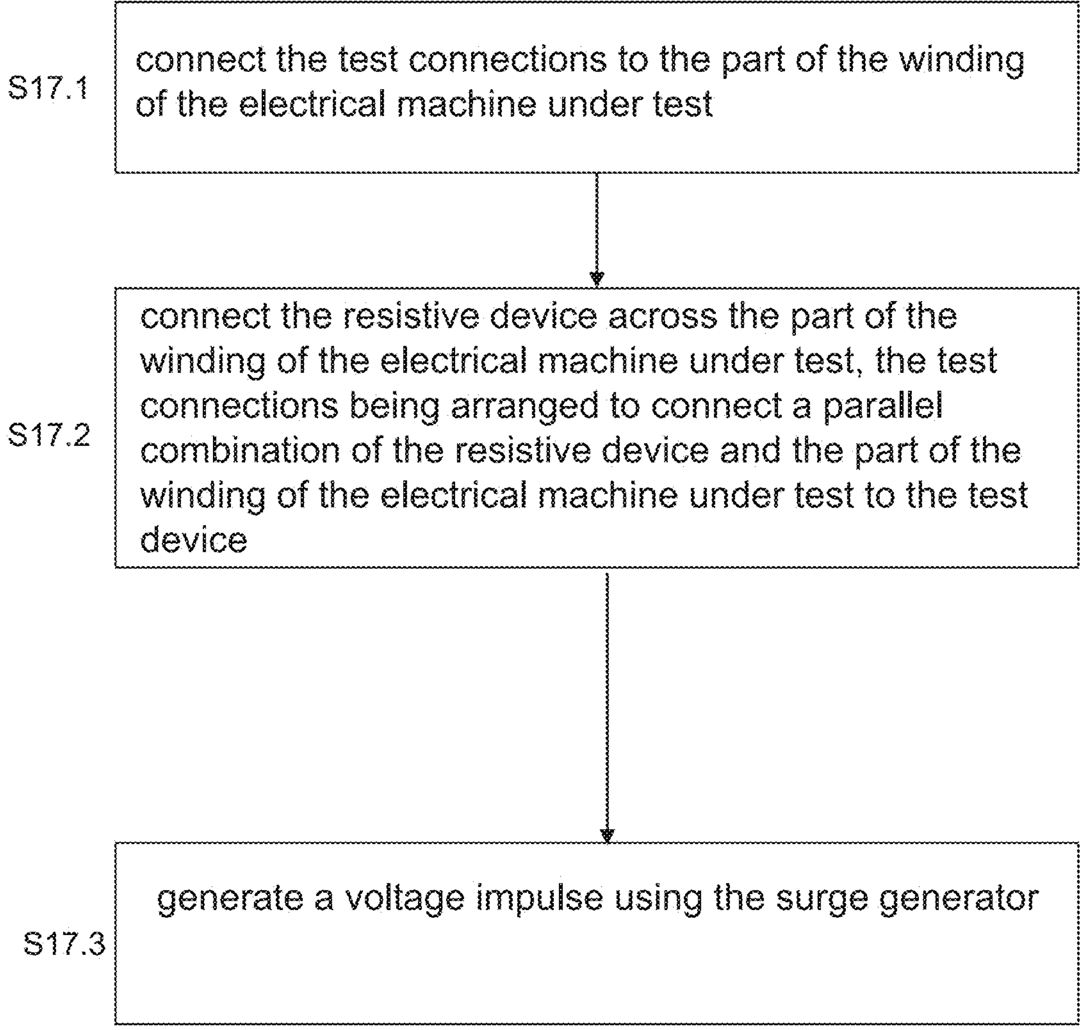
FIG. 17 is a flow diagram of a method of operation of measurement apparatus for performing a surge test of electrical insulation of at least part of a winding of an electrical machine, the apparatus comprising a test device having a surge generator, at least two test connections for connecting the test device to the part of the winding of the electrical device under test, and a damping device.

FIG. 17 is a flow diagram of a method of operation of measurement apparatus according to steps 17.1, 17.2 and 17.3 for performing a surge test of electrical insulation of at least part of a winding of an electrical machine, the apparatus comprising a test device having a surge generator, at least two test connections for connecting the test device to the part of the winding of the electrical device under test, and a damping device.

A test kit may be provided for performing a surge test of electrical insulation of at least part of a winding, the winding being a winding of an electrical machine. The test kit may comprise instructions to perform the surge test according to the method described herein, using a test device 1 having a surge generator 2 configured to generate a voltage impulse and at least two test connections 3*a*, 3*b* for connecting the test device 1 to the part of the winding under test 5. The test kit may also comprise a damping device 4 configured for connection across the part of the winding under test 5. In some examples, the damping device 4 may be configured for connection such that a resistance of the damping device is connected across the part of the winding under test, and the test connections are arranged to connect a parallel combination of the damping device and the part of the winding under test to the test device. The test kit may also comprise suitable the test leads and/or the test device.

Some examples of embodiments are provided by the following examples A to T.

A. A method of operation of measurement apparatus for performing a surge test of electrical insulation of at least part of a winding under test, the winding being a winding of an electrical machine, the apparatus comprising a test device having a surge generator, at least two test connections for connecting to the test device, and a damping device comprising a resistance, the method comprising:

connecting the damping device across the part of the winding under test, the test connections being arranged to connect a parallel combination of the damping device and the part of the winding under test to the test device; and generating a voltage impulse using the surge generator.

B. A method according to example A, comprising:

connecting the test connections to the part of the winding under test using a connecting device, the connecting device comprising the damping device and electrodes for connecting the damping device to the part of the winding under test.

C. A method according to example A or B, wherein the resistance of the damping device is connected across the part of the winding under test to provide a direct current connection.

D. A method according to example A or example B, wherein the damping device comprises a resistance in series with a capacitance, the resistance in series with the capacitance being configured for connection across the part of the winding under test.

E. A method according to example D, wherein the damping device comprises a by-pass resistor connected in parallel with the capacitance.

F. A method according to any preceding example, wherein the resistance has a value in the range 80 Ohm to 400 Ohm.

G. A method according to any one of examples A to E, wherein the resistance has a value in the range 8 Ohm to 40 Ohm.

H. A method according to any preceding example, wherein the voltage impulse has a voltage value of greater than 1 kV and a rise time to peak voltage of less than 500 ns.

I. A method according to any preceding example, wherein an inductance between the damping device and the part of the winding under test is less than an inductance of the test connections between the test device and the damping device.

J. A method according to any preceding example, wherein the damping device comprises a switch in series with the resistance of the damping device, the method comprising setting the switch to a closed state to perform the surge test.

K. A method according to preceding example, wherein the damping device comprises a temperature sensing circuit, and the method comprises measuring a temperature of the damping device using the temperature sensing circuit and inhibiting the generation of the voltage impulse by the surge generator if the temperature exceeds a threshold.

L. A method according to any preceding example, wherein the surge test of electrical insulation of at least part of a winding of the electrical machine comprises a test of electrical insulation between a pair of phase windings of the electrical machine, and wherein the surge test comprises tests of electrical insulation of further pairs of phase windings of the electrical machine, each pair of windings being provided with a respective damping device connected such that the resistance of the damping device is connected across the respective pair of phase windings under test.

M. Measurement apparatus for performing a surge test of electrical insulation of at least part of a winding, the winding being a winding of an electrical machine, the apparatus comprising:

a test device having a surge generator configured to generate a voltage impulse;

at least two test connections for connecting to the test device; and a damping device for connection across the part of the winding under test, the damping device comprising a resistance and being configured for connection such that the test connections are arranged to connect a parallel combination of the damping device and the part of the winding under test to the test device.

N. Measurement apparatus according to example M, wherein the damping device is configured such that the resistance of the damping device is connected across the part of the winding under test, the resistance of the damping device being connected across the part of the winding under test to provide a direct current connection.

O. Measurement apparatus according to example M or example N, wherein the damping device comprises a switch in series with the resistance of the damping device.

P. Measurement apparatus according to any one of examples M-P, wherein the damping device comprises a temperature sensing circuit.

Q. A test kit for performing a surge test of electrical insulation of at least part of a winding, the winding being a winding of an electrical machine, the test kit comprising:

instructions to perform the surge test according to the method of any one of examples A-L using a test device having a surge generator configured to generate a voltage impulse; and a damping device configured for connection across the part of the winding under test, the damping device being configured for connection such that a resistance of the damping device is connected across the part of the winding under test, and test connections being arranged to connect a parallel combination of the damping device and the part of the winding under test to the test device.

R. A connection device for connection of test leads to at least part of a winding of an electrical machine for performing a surge test of electrical insulation of the at least part of a winding when the test leads are connected to a test device having a surge generator, wherein the connection device comprises a damping device comprising a resistance configured for connection across the part of the winding under test, the connection device being configured to connect a parallel combination of the damping device and the part of the winding under test to the test leads.

S. A connection device according to example R, wherein the connection device comprises electrodes configured for connection of the damping device to at least part of the winding.

T. A connection device according to example R or example S, wherein the damping device comprises a resistance in series with a capacitance, the resistance in series with the capacitance being configured for connection across the at least part of the winding.

The above embodiments are to be understood as illustrative examples of the invention. It is to be understood that any feature described in relation to any one embodiment may be used alone, or in combination with other features described, and may also be used in combination with one or more features of any other of the embodiments, or any combination of any other of the embodiments. Furthermore, equivalents and modifications not described above may also be employed without departing from the scope of the invention, which is defined in the accompanying claims.

What we claim is:

1. A method of reducing unwanted high frequency oscillations caused by parasitic inductance of test leads in measurement apparatus for performing a surge test of electrical insulation of at least part of a winding under test, the winding being a winding of an electrical machine, the apparatus comprising a test device having a surge generator and at least two test leads for connecting to the test device, the method comprising:

connecting a damping device comprising a resistance across the part of the winding under test at the far ends of the test leads, at the ends away from the test device, the test leads being arranged to connect a parallel combination of the damping device and the part of the winding under test to the test device; and generating a voltage impulse having a rise time of 300 ns or less using the surge generator, wherein a parasitic inductive component of impedance of the damping device is less than or equal to its resistive impedance, and the parasitic inductive component of impedance of the damping device is less than or equal to the inductive impedance of the test leads.

2. The method of claim 1, comprising:

connecting the test connections to the part of the winding under test using a connection device, the connection device comprising the damping device and electrodes for connecting the damping device to the part of the winding under test.

3. The method of claim 1, wherein the resistance of the damping device is connected across the part of the winding under test to provide a direct current connection.

4. The method of claim 1, wherein the damping device comprises a resistance in series with a capacitance, the resistance in series with the capacitance being configured for connection across the part of the winding under test.

5. The method of claim 4, wherein the damping device comprises a by-pass resistor connected in parallel with the capacitance.

6. The method of claim 1, wherein the resistance has a value in the range 80 Ohm to 400 Ohm.

7. The method of claim 1, wherein the resistance has a value is in the range 8 Ohm to 40 Ohm.

8. A method of claim 1, wherein the voltage impulse has a voltage value of greater than 1 kV and a rise time to peak voltage of less than 500 ns.

9. The method of claim 1, wherein an inductance between the damping device and the part of the winding under test is less than an inductance of the test connections between the test device and the damping device.

10. The method of claim 1, wherein the damping device comprises a switch in series with the resistance of the damping device, the method comprising setting the switch to a closed state to perform the surge test.

11. The method of claim 1, wherein the damping device comprises a temperature sensing circuit, and the method comprises measuring a temperature of the damping device using the temperature sensing circuit and inhibiting the generation of the voltage impulse by the surge generator if the temperature exceeds a threshold.

12. The method of claim 1, wherein the surge test of electrical insulation of at least part of a winding of the electrical machine comprises a test of electrical insulation between a pair of phase windings of the electrical machine, and wherein the surge test comprises tests of electrical insulation of further pairs of phase windings of the electrical machine, each pair of windings being provided with a respective damping device connected such that the resistance of the damping device is connected across the respective pair of phase windings under test.

13. Measurement apparatus for performing a surge test of electrical insulation of at least part of a winding, the winding being a winding of an electrical machine, the apparatus comprising:

a test device having a surge generator configured to generate a voltage impulse having a rise time of 300 ns or less;

at least two test leads for connecting to the test device; and a damping device for connection across the part of the winding under test, the damping device comprising a resistance and being configured for connection such that the test leads are arranged to connect a parallel combination of the damping device and the part of the winding under test to the test device, wherein a parasitic inductive component of impedance of the damping device is less than or equal to its resistive impedance, and the parasitic inductive component of impedance of the damping device is less than or equal to the inductive impedance of the test leads.

14. The measurement apparatus of claim 13, wherein the damping device is configured such that the resistance of the damping device is connected across the part of the winding under test, the resistance of the damping device being connected across the part of the winding under test to provide a direct current connection.

15. The measurement apparatus of claim 13, wherein the damping device comprises a switch in series with the resistance of the damping device.

16. The measurement apparatus of claim 13, wherein the damping device comprises a temperature sensing circuit.

17. A test kit for performing a surge test of electrical insulation of at least part of a winding, the winding being a winding of an electrical machine, the test kit comprising:

instructions to perform the surge test according to the method of claim 1 using a test device having a surge generator configured to generate a voltage impulse having a rise time of 300 ns or less;

at least two test leads for connection to the test device; and a damping device configured for connection across the part of the winding under test, the damping device being configured for connection such that a resistance of the damping device is connected across the part of the winding under test, and the test leads being configured to connect a parallel combination of the damping device and the part of the winding under test to the test device, wherein a parasitic inductive component of impedance of the damping device is less than or equal to its resistive impedance, and the parasitic inductive component of impedance of the damping device is less than or equal to the inductive impedance of the test leads.

18. A connection device for connection of test leads to at least part of a winding of an electrical machine for performing a surge test comprising generating a voltage impulse having a rise time of 300 ns or less of electrical insulation of the at least part of a winding when the test leads are connected to a test device having a surge generator, wherein the connection device comprises a damping device comprising a resistance configured for connection across the part of the winding under test, the connection device being configured to connect a parallel combination of the damping device and the part of the winding under test to the test leads, wherein a parasitic inductive component of impedance of the damping device is less than or equal to its resistive impedance, and the parasitic inductive component of impedance of the damping device is less than or equal to the inductive impedance of the test leads.

19. The connection device of claim 18, wherein the connection device comprises electrodes configured for connection of the damping device to at least part of the winding.

20. The connection device of claim 19, wherein the damping device comprises a resistance in series with a capacitance, the resistance in series with the capacitance being configured for connection across the at least part of the winding.

* * * * *